United States Patent
Tsuji

(10) Patent No.: US 12,556,167 B2
(45) Date of Patent: Feb. 17, 2026

(54) OSCILLATOR CIRCUIT

(71) Applicant: ROHM CO., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/985,428

(22) Filed: Dec. 18, 2024

(65) Prior Publication Data
US 2025/0211210 A1    Jun. 26, 2025

(30) Foreign Application Priority Data

Dec. 26, 2023    (JP) .................................. 2023-219886

(51) Int. Cl.
*H03K 3/0231* (2006.01)
*H03B 5/24* (2006.01)
*H03K 3/011* (2006.01)

(52) U.S. Cl.
CPC ............. *H03K 3/0231* (2013.01); *H03B 5/24* (2013.01); *H03K 3/011* (2013.01)

(58) Field of Classification Search
CPC ......... H03K 3/0231; H03K 3/011; H03B 5/24

USPC .............................. 331/108 R, 176, 111, 143
See application file for complete search history.

(56) References Cited

FOREIGN PATENT DOCUMENTS

EP            4395173 A1  *  7/2024  ............. H03K 4/501
JP         2020167527 A      10/2020

* cited by examiner

*Primary Examiner* — Arnold M Kinkead
(74) *Attorney, Agent, or Firm* — CANTOR COLBURN LLP

(57) ABSTRACT

A first current source and a second current source generate a first current and a second current, respectively. A first transistor is arranged with its drain coupled to the first current source and a reference voltage applied to its source. A second transistor is coupled between a first end of a capacitor and a first node. A third transistor is coupled between a second end of the capacitor and a second node. A first switch is coupled between the first node and the second current source. A second switch is coupled between the second node and the second current source. A charging/discharging circuit includes a third switch coupled between the first end of the capacitor and the ground and a fourth switch coupled between the second end of the capacitor and the ground.

11 Claims, 16 Drawing Sheets

OSCILLATOR CIRCUIT

CROSS REFERENCE TO RELATED APPLICATIONS

The present invention claims priority under 35 U.S.C. § 119 to Japanese Application No. 2023-219886 filed Dec. 26, 2023, the entire content of which is incorporated herein by reference.

BACKGROUND

1. Technical Field

The present disclosure relates to an oscillator circuit.

2. Description of the Related Art

Digital circuits and frequency synthesizers require a reference clock for their operation. An oscillator is employed to generate such a reference clock. Examples of oscillators include oscillators employing quartz resonators, ceramic resonators and Micro Electro Mechanical Systems (MEMS) resonators, LC oscillators, CR oscillators, ring oscillators, multi-vibrators, relaxation oscillators, and the like.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Overview of the Embodiments

Figure 1:
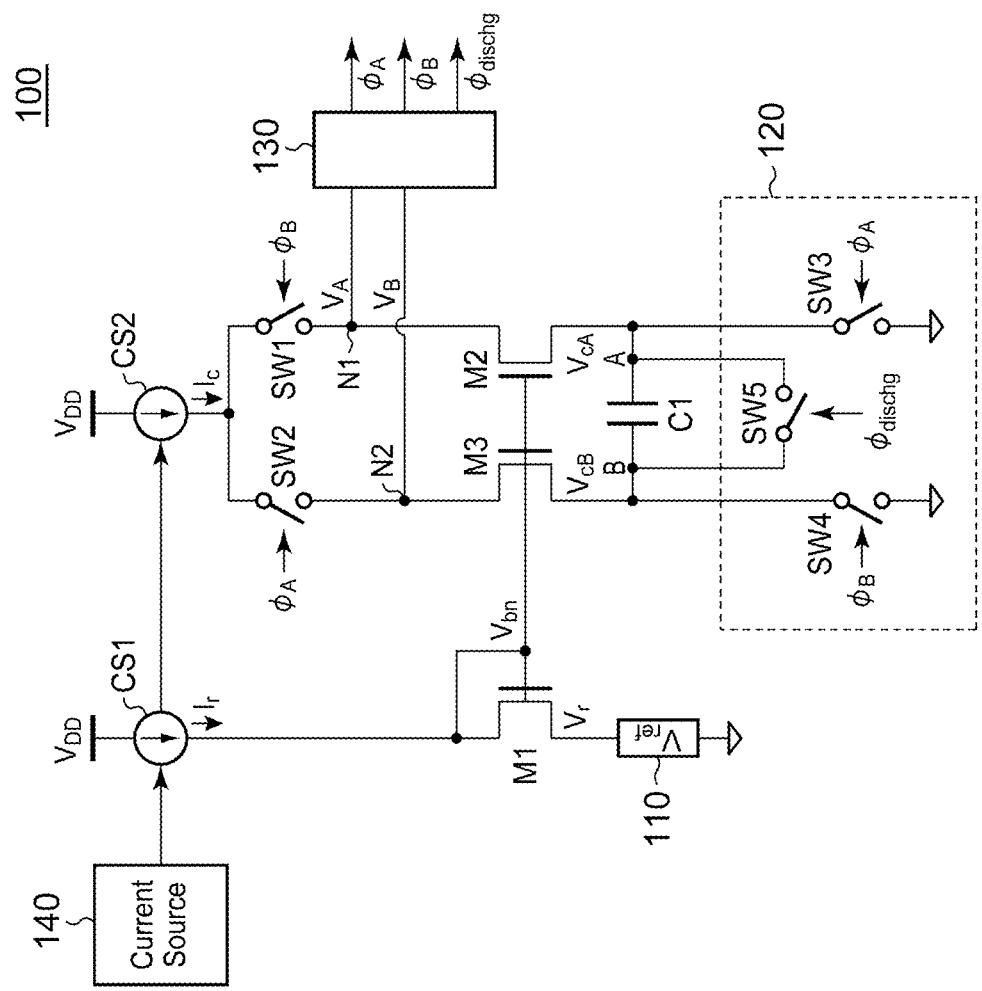
FIG. 1 is a circuit diagram of an oscillator circuit according to an embodiment.

Description will be made regarding the outline of several exemplary embodiments of the present disclosure. The outline is a simplified explanation regarding several concepts of one or multiple embodiments as a preface to the detailed description described later in order to provide a basic understanding of the embodiments. That is to say, the outline described below is by no means intended to restrict the scope of the present disclosure. The outline is by no means a comprehensive outline of all possible embodiments. That is to say, the outline is by no means intended to identify the indispensable or essential elements of all the embodiments and is by no means intended to define the scope of a part of or all the embodiments. For convenience, in some cases, an "embodiment" as used in the present specification represents a single or multiple embodiments (examples and modifications) disclosed in the present specification.

SUMMARY

An oscillator circuit according to one embodiment includes: a first current source structured to generate a first current; a second current source structured to generate a second current; a first node and a second node; a first transistor having a drain coupled to the first current source; a reference voltage circuit structured to generate a reference voltage at a source of the first transistor; a capacitor; a second transistor having a source coupled to a first end of the capacitor, a drain coupled to the first node, and a gate coupled to a gate of the first transistor; a third transistor having a source coupled to a second end of the capacitor, a drain coupled to the second node, and a gate coupled to the gate of the first transistor; a first switch coupled between the first node and the second current source; a second switch coupled between the second node and the second current source; a charging/discharging circuit comprising a third switch coupled between the first end of the capacitor and a ground and a fourth switch coupled between the second end of the capacitor and the ground; and a control circuit structured to switch between (i) a first state in which the second switch and the third switch are turned on and the first switch and the fourth switch are turned off and (ii) a second state in which the second switch and the third switch are turned off and the first switch and the fourth switch are turned on based on a first voltage that occurs at the first node and a second voltage that occurs at the second node, and to control the charging/discharging circuit so as to discharge the capacitor in a discharging period that is a first portion of the first state and a discharging period that is a first portion of the second state.

With this configuration, this requires a single capacitor to generate a pulse signal with a duty cycle of 50%. This allows the circuit area to be reduced as compared with an arrangement including two capacitors.

In one embodiment, the charging/discharging circuit may further include a fifth switch coupled in parallel with the capacitor and structured to be turned on in the discharging period.

In one embodiment, the control circuit may turn on the third switch and the fourth switch in the discharging period.

In one embodiment, the charging/discharging circuit may further include: a sixth switch coupled between the first node and the ground; and a seventh switch coupled between the second node and the ground. Also, the control circuit may turn off the sixth switch and turn on the seventh switch in the first state. Also, the control circuit may turn on the sixth switch and turn off the seventh switch in the second state.

In one embodiment, the oscillator circuit may further include a reference current source structured to generate a reference current. Also, the first current source may generate a first current that corresponds to the reference current. The second current source may generate a second current that corresponds to the reference current.

In one embodiment, the reference current source may include a β-multiplier self-bias circuit.

In one embodiment, the first transistor, the reference voltage circuit, and the first current source may be configured to also function as a part of the β-multiplier self-bias circuit. This allows the circuit area to be further reduced.

Also, the reference voltage circuit also include a resistor.

In one embodiment, the reference voltage circuit may include a reference voltage source.

In one embodiment, the reference voltage circuit may include an NMOS transistor having a gate that receives a bias voltage.

In one embodiment, the control circuit may include: a flipflop structured to be set according to the first voltage and to be reset according to the second voltage; and a pulse generator structured to generate a discharging control signal to be asserted in a predetermined period in response to a state transition of the flipflop.

Embodiments

Description will be made below regarding preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present invention. Also, it is not necessarily essential for the present invention that all the features or a combination thereof be provided as described in the embodiments.

In the present specification, a state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, a state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

FIG. 1 is a circuit diagram of an oscillator circuit 100 according to an embodiment. The oscillator circuit 100 includes a first current source CS1, a second current source CS2, a first transistor M1 to a third transistor M3 each configured as an NMOS transistor, a first node N1, a second node N2, a reference voltage circuit 110, a charging/discharging circuit 120, a reference current source 140, a capacitor C1, a first switch SW1, and a second switch SW2, which are integrated on a single semiconductor substrate.

A first current source CS1 generates a first current Ir. The second current source CS2 generates a second current Ic. The first current Ir and the second current Ic are each generated according to a reference current $I_{ref}$ generated by the reference current source 140.

The first transistor M1 is arranged with its drain coupled to the first current source CS1. The reference voltage circuit 110 generates a reference voltage Vr at the source of the first transistor M1.

The second transistor M2 is arranged with its source coupled to a first end A of the capacitor C1, its drain coupled to a first node N1, and its gate coupled to a gate of the first transistor M1. The third transistor M3 is arranged with its source coupled to a second end B of the capacitor C1, its drain coupled to the second node N2, and its gate coupled to the gate of the first transistor M1. A bias voltage Von generated at the gate of the first transistor M1 is supplied to the gates of the second transistor M2 and the third transistor M3.

The first switch SW1 is coupled between the first node N1 and the second current source C2. The second switch SW2 is coupled between the second node N2 and the second current source CS2.

The charging/discharging circuit 120 includes a third switch SW3 coupled between the first end A of the capacitor C1 and the ground and a fourth switch SW4 coupled between the second end B of the capacitor C1 and the ground. The charging/discharging circuit 120 further includes a fifth switch SW5 coupled in parallel with the capacitor C1.

The control circuit 130 controls the first switch SW1 to the fifth switch SW5 based on the first voltage $V_A$ generated at the first node N1 and the second voltage $V_B$ generated at the second node N2.

The control circuit 130 switches between (i) the first state $\phi A$ in which the first switch SW1 and the fourth switch SW4 are turned off and the second switch SW2 and the third switch SW3 are turned on, and (ii) the second state $\phi_B$ in which the first switch SW1 and the fourth switch SW4 are turned on and the second switch SW2 and the third switch SW3 are turned off. Furthermore, the control circuit 130 controls the charging/discharging circuit 120 so as to discharge the capacitor C1 in a discharging period $\phi_{dischg}$, which is the first portion of the first state $\phi_A$, and a discharging period $\phi_{dischg}$, which is the first portion of the second state $\phi_B$. With the present embodiment, in the discharging period $\phi_{dischg}$, the fifth switch SW5 is turned on so as to reset the charge stored in the capacitor C1. In FIG. 1, the reference symbols $\phi_A$, $\phi_B$, and $\phi_{dischg}$ each represent a state. Furthermore, the reference symbols $\phi A$, $\phi_B$, and $\phi_{dischg}$ each represent a control signal to be supplied to a switch to be turned on in the corresponding state.

The above is the configuration of the oscillator circuit 100. Next, description will be made regarding the operation thereof.

Figure 2:
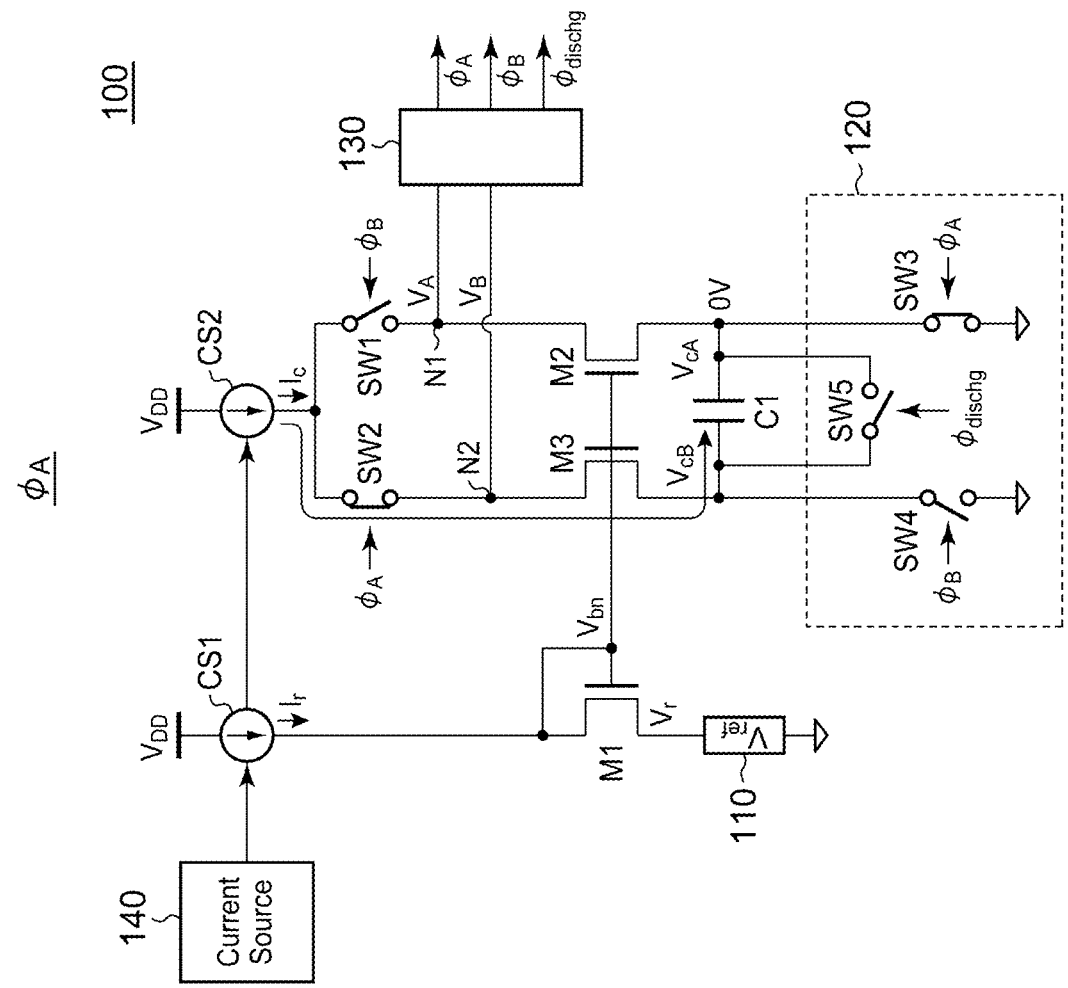
FIG. 2 is a circuit diagram of the oscillator circuit in a first state.

FIG. 2 is a circuit diagram of the oscillator circuit 100 in the first state A. In the first state $\phi_A$, the second switch SW2 and the third switch SW3 are turned on and the first switch SW1 and the fourth switch SW4 are turned off. In this state, the third switch SW3 is turned on. Accordingly, the electric potential at the first end A of the capacitor C1 decreases toward 0 V. Furthermore, the second switch SW2 is turned on. Accordingly, the second current Ic generated by the second current source CS2 is supplied to the second end B of the capacitor C1 via the second switch SW2 and the third transistor M3.

During the discharging period $\phi_{dischg}$, which is the first portion of the first state $\phi_A$, the fifth switch SW5 is turned on. Accordingly, the voltage $V_{cB}$ at the second end B of the capacitor C1 becomes equal to the voltage $V_{cA}$ at the first end A.

After the discharging period $\phi_{dischg}$ ends, the fifth switch SW5 is turned off. In this state, the capacitor C1 is charged by the second current Ic. Accordingly, the voltage $V_{cB}$ at the second end B rises with time. This leads to an increase in the second voltage $V_B$ at the second node N2.

The oscillator circuit 100 operates as a comparator that compares a reference voltage Vr with the voltage $V_{cB}$ at the second end B of the capacitor C1 in the first state $\phi_A$. When the second voltage $V_B$ exceeds a given threshold value Vt, the control circuit 130 transits to the second state $\phi_B$.

In the second state $\phi_B$, the oscillator circuit 100 provides an operation that is symmetrical to that in the first state $\phi_A$. That is to say, the first voltage $V_A$ rises with time. When the first voltage $V_A$ exceeds the threshold value Vt, the control circuit 130 transits to the first state $\phi_A$.

Figure 3:
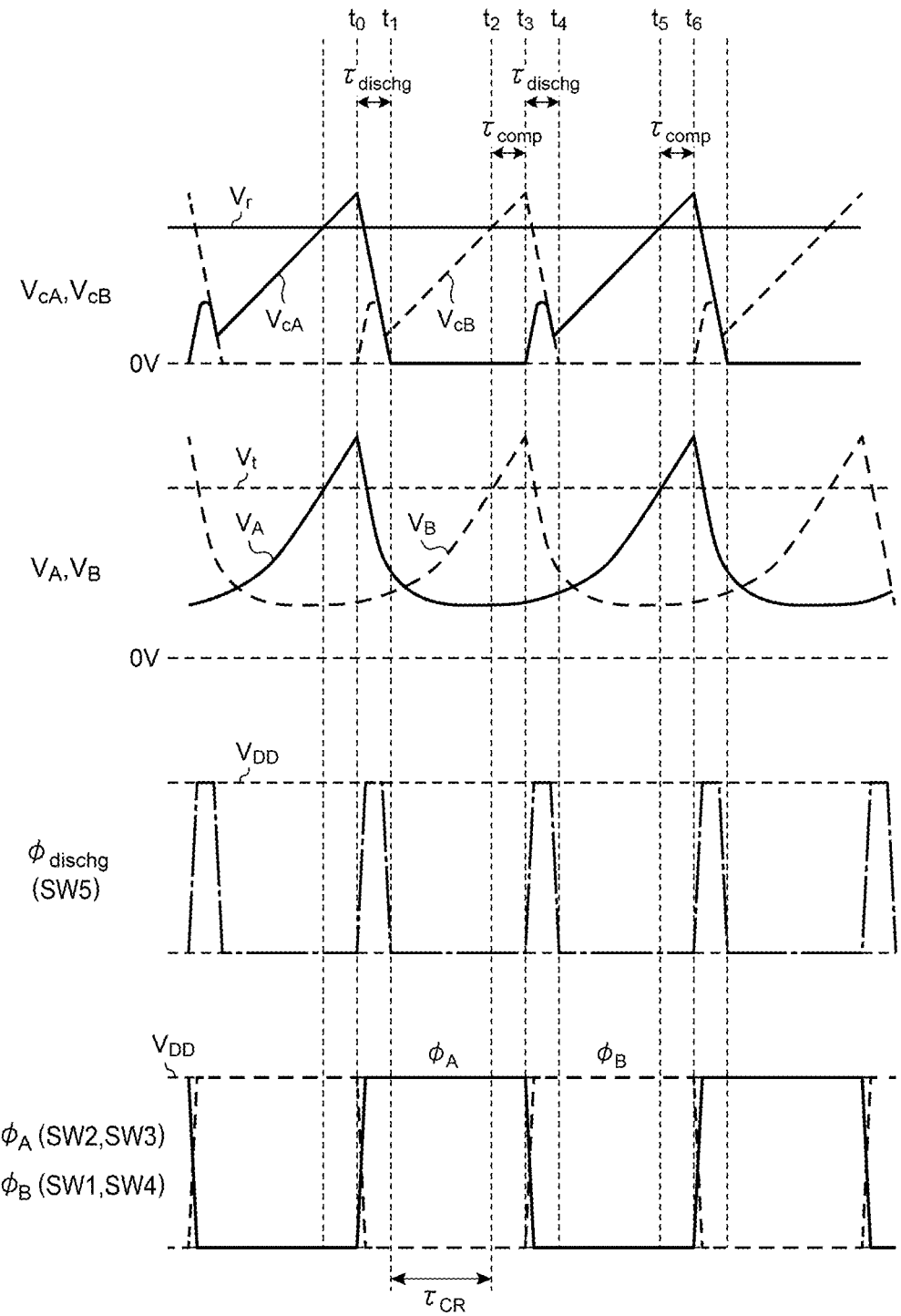
FIG. 3 is a waveform diagram showing the operation of the oscillator circuit shown in FIG. 1.

FIG. 3 is a waveform diagram showing the operation of the oscillator circuit 100 shown in FIG. 1.

First State $\phi_A$

At the time to, the oscillator circuit 100 becomes the first state $\phi_A$. In this state, the third switch SW3 is turned on. Accordingly, the voltage $V_{cA}$ at the first end A of the capacitor C1 decreases. Furthermore, the first portion of the first state $\phi_A$ functions as the discharging period $\phi_{dischg}$. In this period, the fifth switch SW5 is turned on. Accordingly, the voltage $V_{cB}$ at the second end B approaches the voltage $V_{cA}$ at the first end A.

When the discharging period $\phi_{dischg}$ ends and the fifth switch SW5 is turned off at the time $t_1$, the voltage $V_{cB}$ rises with a constant slope determined by the second current Ic. At the time $t_2$ after the time constant $\tau_{CR}$ determined by the circuit constant elapses from the time $t_1$, the voltage $V_{cB}$ exceeds the reference voltage Vr. In this state, the voltage $V_B$ increases together with the voltage $V_{cB}$ and exceeds a judgment threshold voltage Vt of the control circuit 130. Accordingly, the control circuit 130 transits to the second state $\phi_B$ at the time $t_3$ after a delay time $\tau_{COMP}$ defined for comparison elapses.

Second State $\phi_B$

When the oscillator circuit 100 becomes the second state $\phi_B$ at the time $t_3$, the fourth switch SW4 is turned on, leading to a decrease in the voltage $V_{cB}$ at the second end B of the capacitor C1. Furthermore, the first portion of the second state $\phi_B$ functions as the discharging period $\phi_{dischg}$. In this period, the fifth switch SW5 is turned on. Accordingly, the voltage $V_{cA}$ at the first end A approaches the voltage $V_{cB}$ at the second end B.

When the discharging period $\phi_{dischg}$ ends and the fifth switch SW5 is turned off at the time $t_4$, the voltage $V_{cA}$ rises with a constant slope determined by the second current Ic. The voltage $V_{cA}$ exceeds the reference voltage Vr at the time $t_5$. In this state, the voltage $V_A$ rises together with the voltage $V_{cA}$ and exceeds a judgment threshold voltage Vt of the control circuit 130. Accordingly, the control circuit 130 transits to the first state $\phi_A$ at the time to after the delay time $\tau_{comp}$ defined for comparison elapses.

The above is the operation of the oscillator circuit 100. The oscillation period $T_{OSC}$ of the oscillator circuit 100 is represented by the following Expression.

$$T_{OSC} = \tau_{dischg} + \tau_{CR} + \tau_{comp}$$

Here, $\tau_{dischg}$ represents the length of the discharging period $\phi_{dischg}$.

The advantage of the oscillator circuit 100 can be clearly understood based on a comparison with an oscillator circuit 100R according to a comparison technique. Description will be made regarding the comparison technique.

Figure 4:
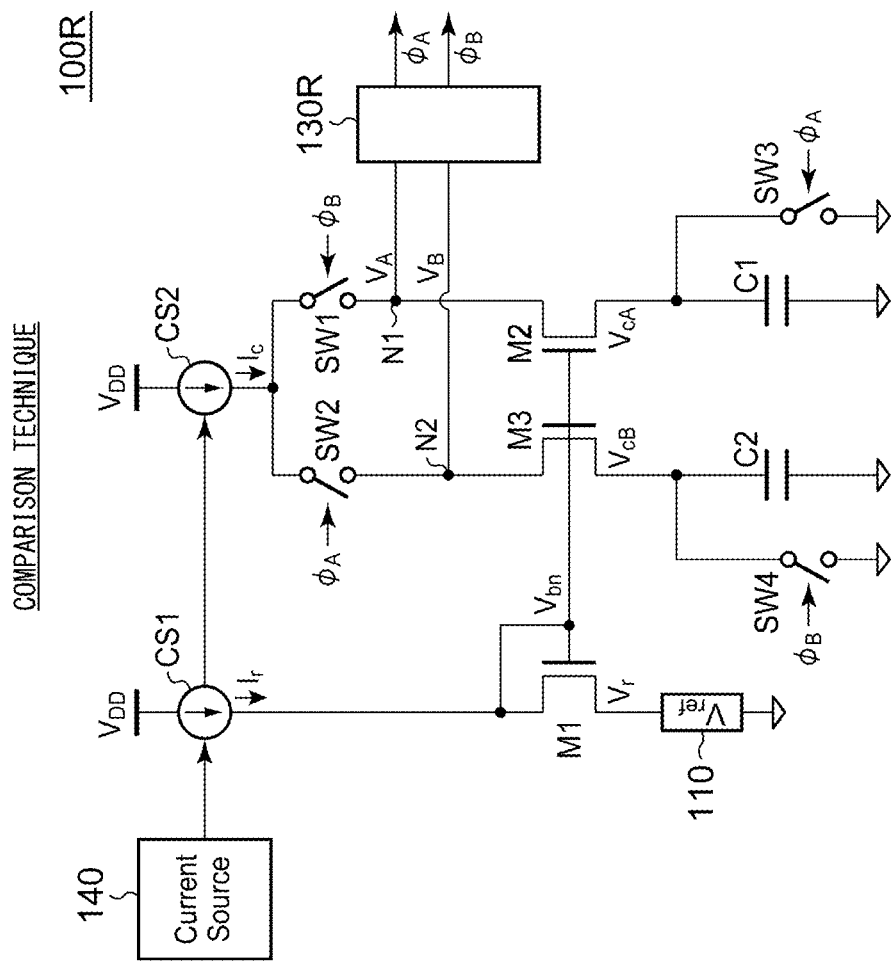
FIG. 4 is a circuit diagram of an oscillator circuit according to a comparison technique.

FIG. 4 is a circuit diagram of an oscillator circuit 100R according to the comparison technique. The oscillator circuit 100R includes two capacitors C1 and C2. The first end of the first capacitor C1 is grounded, and the second end thereof is coupled to the source of the second transistor M2. The third switch SW3 is coupled in parallel with the first capacitor C1. The first end of the second capacitor C2 is grounded, and the second end thereof is coupled to the source of the third transistor M3. The fourth switch SW4 is coupled in parallel with the capacitor C2.

In the comparison technique, the discharging period $\phi_{dischg}$ is not provided. The control circuit 130R alternately repeats the first state $\phi_A$ and the second state $\phi_B$ based on the first voltage $V_A$ at the first node N1 and the second voltage $V_B$ at the second node N2.

Figure 5:
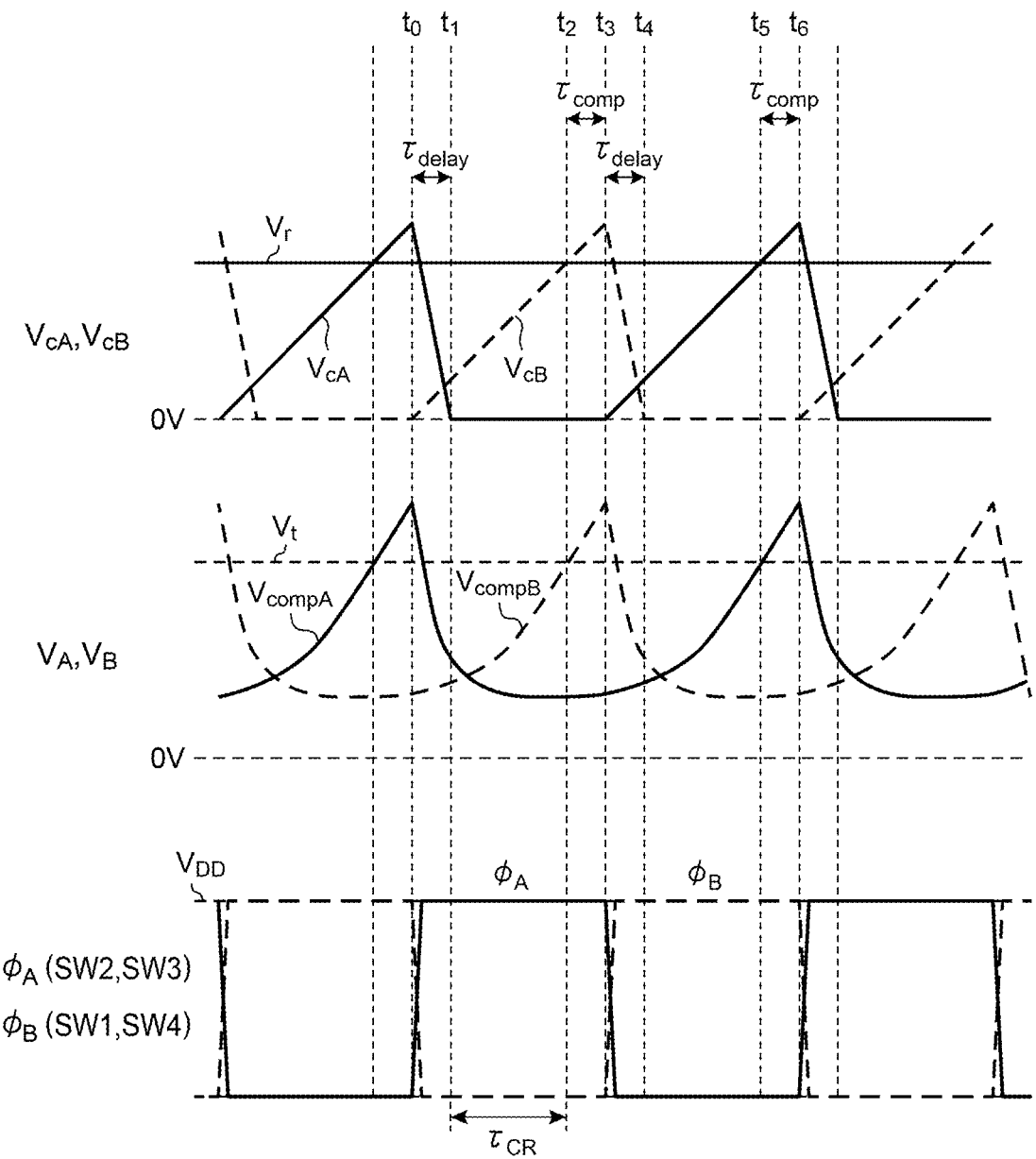
FIG. 5 is waveform diagram showing the operation of the oscillator circuit shown in FIG. 4.

FIG. 5 is a waveform diagram showing the operation of the oscillator circuit 100R shown in FIG. 4.

First State $\phi_A$

In the second state $\phi_B$ before the time to, the fourth switch SW4 is turned on. Accordingly, the voltage $V_{cB}$ across the capacitor C2 becomes 0 V.

At the time to, the oscillator circuit 100R becomes the first state $\phi_A$. In this state, the third switch SW3 is turned on. Accordingly, the voltage $V_{cA}$ across the capacitor C1 decreases.

In the first state $\phi_A$, the voltage $V_{cB}$ across the second capacitor C2 rises with a constant slope determined by the second current Ic. At the time $t_2$, the voltage $V_{cB}$ exceeds the reference voltage Vr. In this state, the voltage $V_B$ rises together with the voltage $V_{cB}$ and exceeds the judgment threshold voltage Vt of the control circuit 130. Accordingly, at the time $t_3$ after the delay time $\tau_{comp}$ defined for comparison elapses, the control circuit 130 transits to the second state $\phi_B$.

Second State $\phi_B$

When the oscillator circuit 100R becomes the second state $\phi_B$ at the time $t_3$, the voltage $V_{cA}$ across the first capacitor C1 rises with a constant slope determined by the second current Ic. The voltage $V_{cA}$ exceeds the reference voltage Vr at the time $t_5$. In this state, the voltage $V_A$ rises together with the voltage $V_{cA}$ and exceeds the judgment threshold voltage Vt of the control circuit 130. Accordingly, the o control circuit 130 transits to the first state $\phi_A$ at the time to after the delay time $\tau_{comp}$ defined for comparison elapses.

The above is the operation of the oscillator circuit 100R. With the comparison technique employing the two capacitors C1 and C2, this provides the following advantages.

First Advantage

This is capable of generating a pulse signal with a duty cycle of 50%.

Second Advantage

During a period in which one of the two capacitors C1 and C2 is being charged, the other capacitor (C2 or C1) is being discharged. With this, the period τdelay in which the capacitor C2 (C1) is being discharged has no effect on the oscillation period $T_{OSC}$. Accordingly, the oscillation period $T_{OSC}$ is determined by the comparison time $\tau_{comp}$ and the time constant $\tau_{CR}$.

$$T_{OSC} = \tau_{comp} + \tau_{CR}$$

Third Advantage

This allows the discharging time $\tau_{delay}$ to be designed to be short. This allows the oscillation period $T_{OSC}$ to be easily shortened. In other words, this allows the oscillation frequency $f_{OCS}(=1/T_{OSC})$ to be easily increased.

However, the oscillator circuit 100 according to the comparison technique requires two capacitors C1 and C2. The capacitors C1 and C2 each occupy a relatively large area on a semiconductor substrate. This leads to difficulty in designing the oscillator circuit 100R to have a compact size.

Returning to the embodiment, description will be made. The oscillator circuit 100 according to the embodiment provides the three advantages obtained with the comparison technique. In addition, the present embodiment allows the number of the capacitors to be reduced to one. This allows the circuit area to be reduced.

The present disclosure encompasses various kinds of apparatuses and methods that can be regarded as a block configuration or a circuit configuration shown in FIG. 1, or otherwise that can be derived from the aforementioned description. That is to say, the present disclosure is not restricted to a specific configuration. More specific description will be made below regarding example configurations or examples for clarification and ease of understanding of the essence of the present disclosure and the present invention and the operation thereof. That is to say, the following description will by no means be intended to restrict the technical scope of the present disclosure.

Example 1

Figure 6:
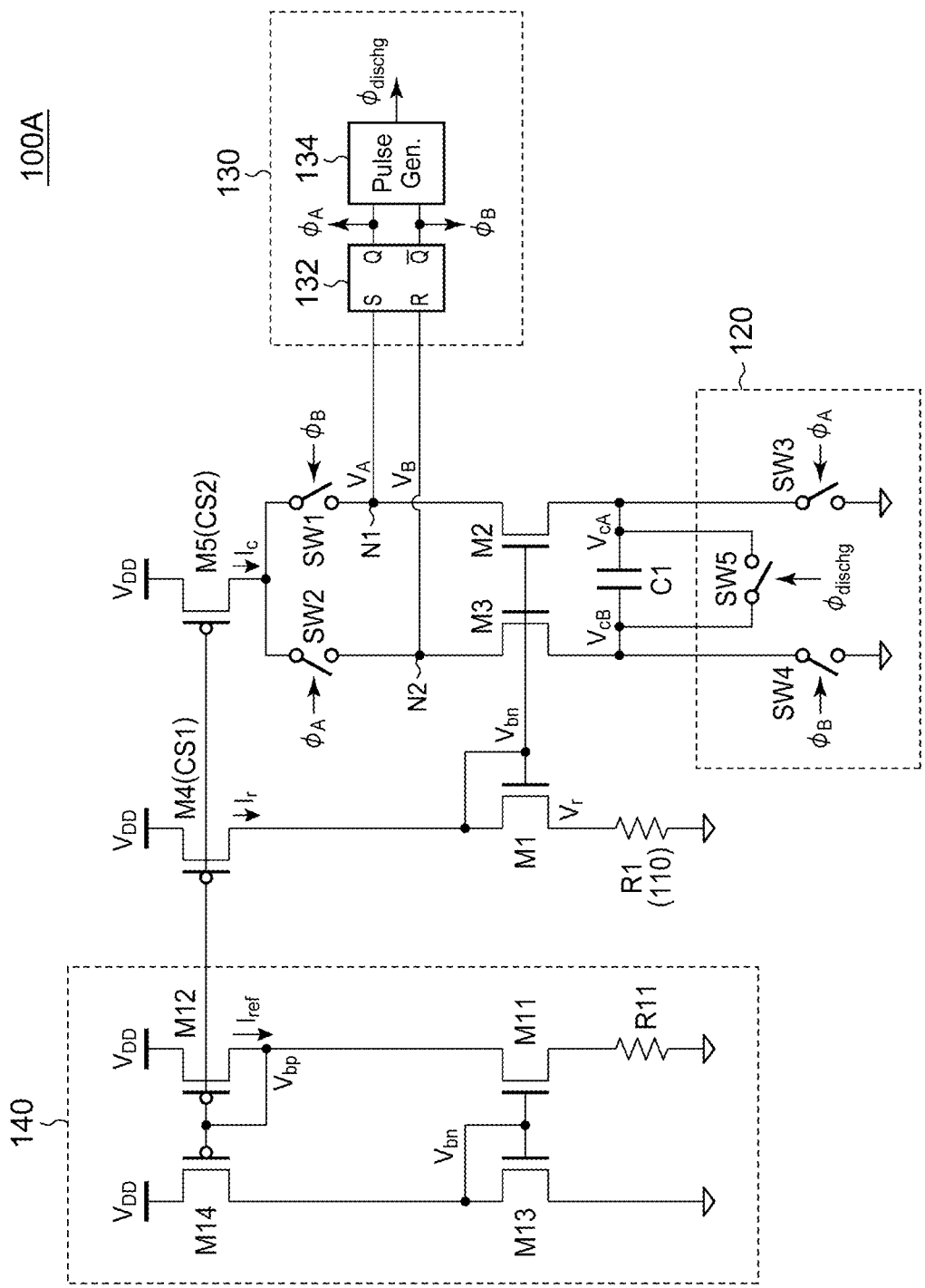
FIG. 6 is a circuit diagram of an oscillator circuit according to an example 1.

FIG. 6 is a circuit diagram of an oscillator circuit 100A according to an example 1. The control circuit 130 includes a flipflop 132 and a pulse generator 134. The flipflop 132 is configured as an SR latch (SR flipflop) and receives the first voltage $V_A$ at the first node N1 via its set terminal(S) and the voltage $V_B$ at the second node N2 via its reset terminal (R). The non-inverting output Q of the flipflop 132 is used as a control signal for an element configured to turn on in the first state $\phi_A$. The inverting output /Q of the flipflop 132 is used as a control signal for an element configured to turn on in the second state $\phi_B$.

The pulse generator 134 generates a discharging control signal $\phi_{dischg}$ based on at least one of the outputs Q and/Q ("/" represents logical inversion) of the flipflop 132. During the discharging time $\tau_{dischg}$, the pulse generator 134 generates a pulse signal (discharging control signal $\phi_{dischg}$) that becomes a predetermined level (e.g., high level) in response to the state transition of the flipflop 132.

The reference current source 140 includes a so-called β-multiplier self-bias circuit. Specifically, the reference current source 140 includes NMOS transistors M11 and M13, PMOS transistors M12 and M14, and a resistor R11. The first current source CS1 includes a fourth transistor M4. The second current source CS2 includes a fifth transistor M5. The fourth transistor M4 and the fifth transistor M5 form a current mirror circuit together with the transistor M12 of the reference current source 140. A first current Ir that is proportional to the reference current $I_{ref}$ generated by the reference current source 140 flows through the fourth transistor M4. A second current Ic that is proportional to the reference current $I_{ref}$ flows through the fifth transistor M5.

Furthermore, in the present embodiment, the reference voltage circuit 110 includes a first resistor R1. Accordingly, the reference voltage Vr is represented by Ir×R1.

Figure 7:
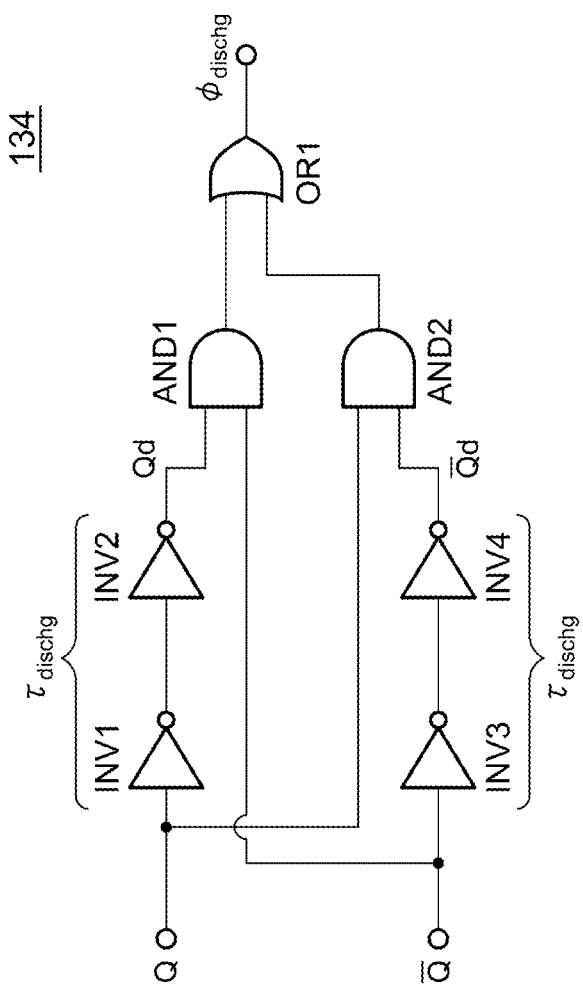
FIG. 7 is a circuit diagram showing an example configuration of a pulse generator.

FIG. 7 is a circuit diagram showing an example configuration of the pulse generator 134. The pulse generator 134 includes inverters INV1 through INV4, AND gates AND1 and AND2, and an OR gate OR1. The inverters INV1 and INV2 delay the output Q of the SR flipflop that is a previous stage. The delay time provided by the two inverters INV1 and INV2 corresponds to the discharging time $\tau_{dischg}$. The AND gate AND1 generates the logical AND of the output Qd after the delay and the output Q before the delay. The output of the AND gate AND1 is configured as a pulse signal that becomes the high level during the delay time $\tau_{dischg}$ from a positive edge of the output Q.

Similarly, the inverters INV3 and INV4 delay the inverting output/Q of the previous SR flip-flop. The AND gate AND2 generates the logical AND of the inverting output/Q after the delay and the inverting output/Q before the delay. The output of the AND gate AND2 is configured as a pulse signal that becomes the high level during the delay time $\tau_{dischg}$ from a positive edge of the inverting output/Q.

The OR gate OR1 generates the logical OR of the outputs of the AND gates AND1 and AND2, and outputs the logical OR as the discharging control signal $\phi_{dischg}$.

Example 2

Figure 8:
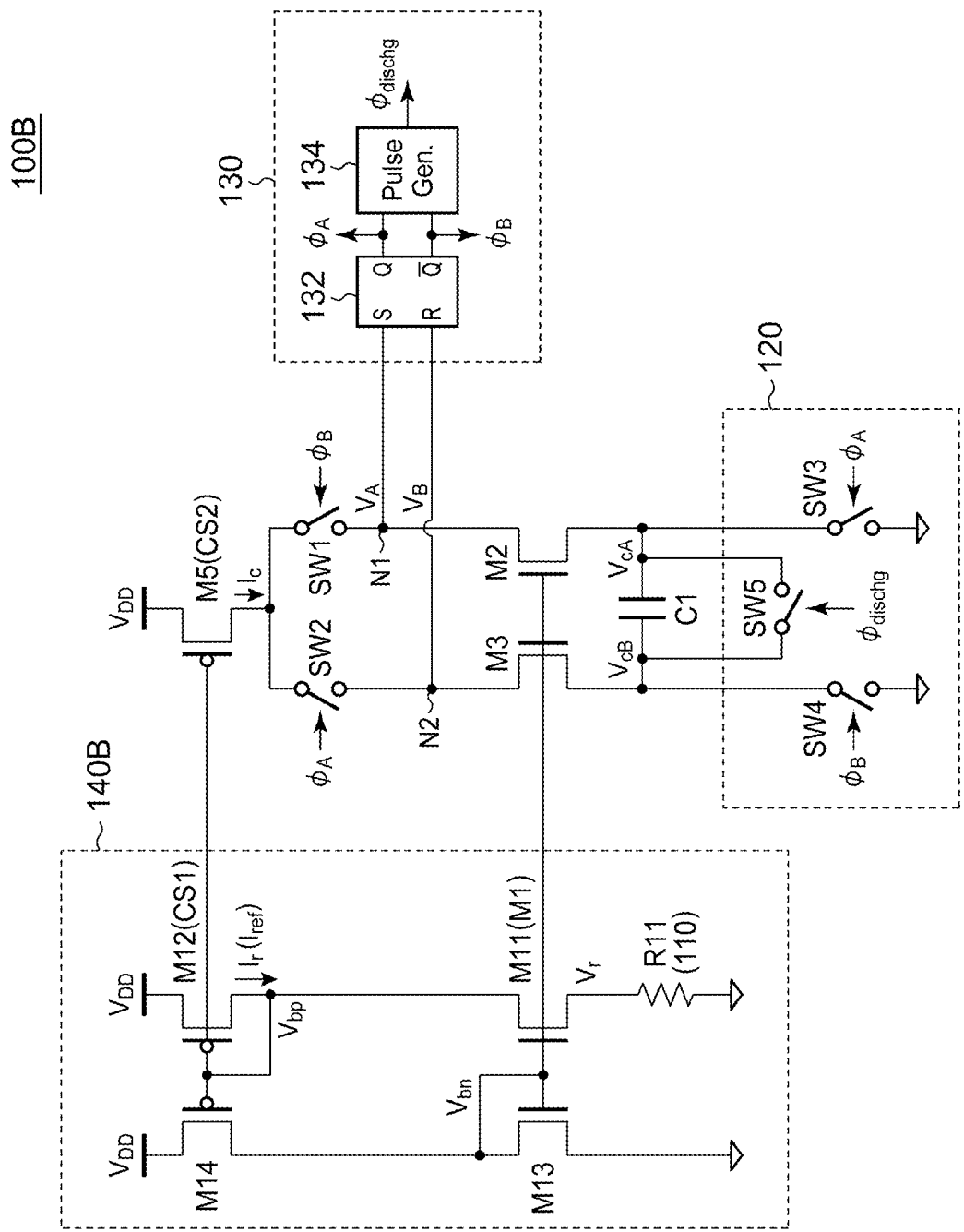
FIG. 8 is a circuit diagram of an oscillator circuit according to an example 2.

FIG. 8 is a circuit diagram of an oscillator circuit 100B according to an example 2. In this example, the first transistor M1, the fourth transistor M4 (first current source CS1), and the resistor R1 (reference voltage circuit 110) are built into the reference current source 140B. In other words, the transistor M12 of the β-multiplier self-bias circuit also functions as the first current source CS1 (transistor M4 shown in FIG. 6). The transistor M11 also functions as the first transistor M1. The resistor R11 also functions as the reference voltage circuit 110.

With the embodiment 2, this allows the circuit area and the current consumption to be further reduced as compared with the example 1.

Figure 9:
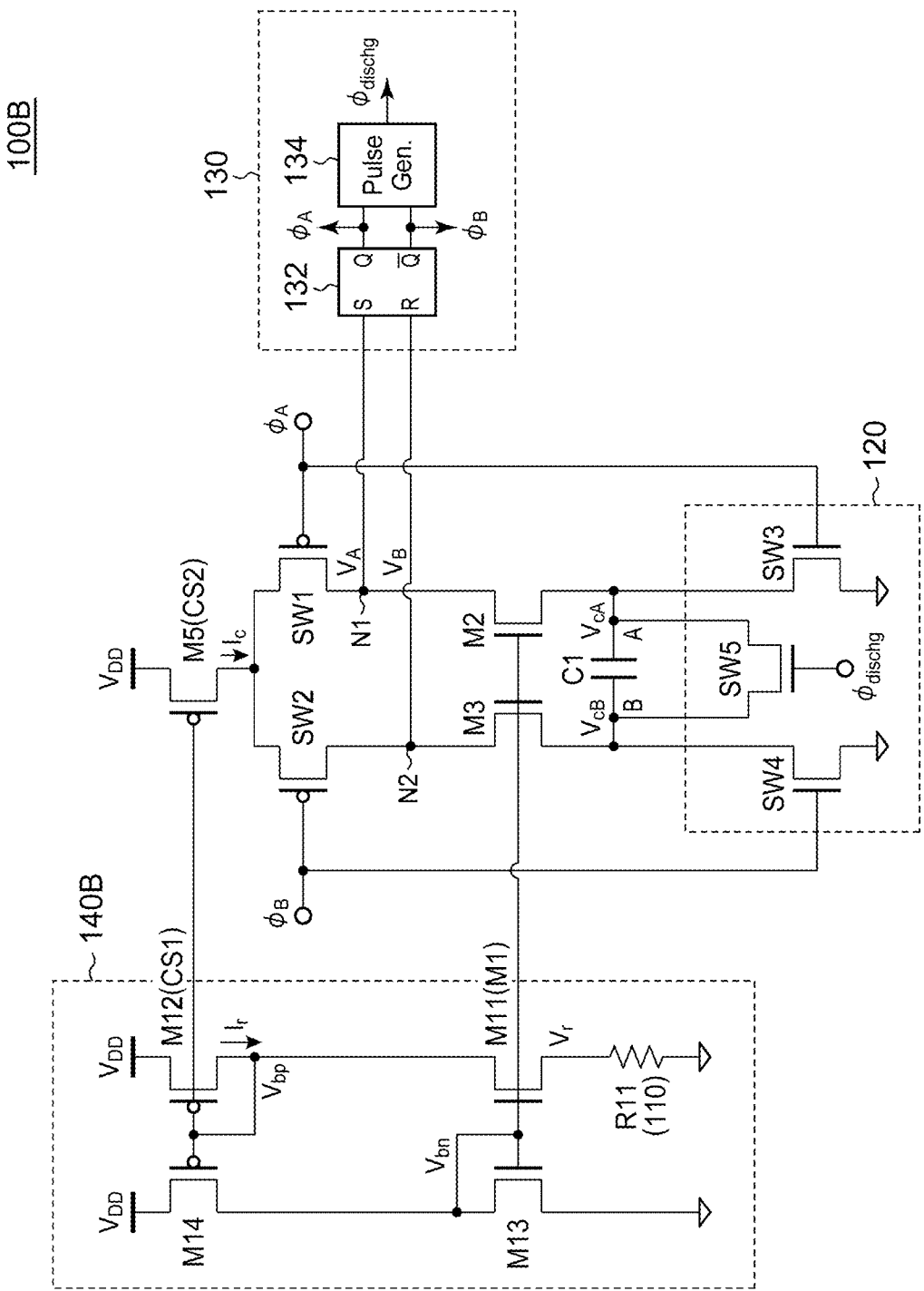
FIG. 9 is a more specific circuit diagram of the oscillator circuit shown in FIG. 8.

FIG. 9 is a more specific circuit diagram of the oscillator circuit 100B shown in FIG. 8. The third switch SW3 and the fourth switch SW4 are each configured as an NMOS transistor. The gate of the third switch SW3 receives an input of a first control signal QA that is at the high level in the first state $\phi_A$. The gate of the fourth switch SW4 receives an input of a second control signal $\phi_B$ that is at the high level in the second state $\phi_B$.

The fifth switch SW5 is configured as an NMOS transistor. The gate of the fifth switch SW5 receives an input of a control signal that is at the high level in the discharging period $\phi_{dischg}$.

The first switch SW1 and the second switch SW2 are each configured as a PMOS transistor. The PMOS transistor turns on when a low-level signal is input to its gate. Accordingly, the gate of the first switch SW1 receives an input of the first control signal QA that is at the low level in the second state QB. The gate of the second switch SW2 receives an input of the second control signal $\phi_B$ in the second state $\phi_B$.

Example 3

Figure 10:
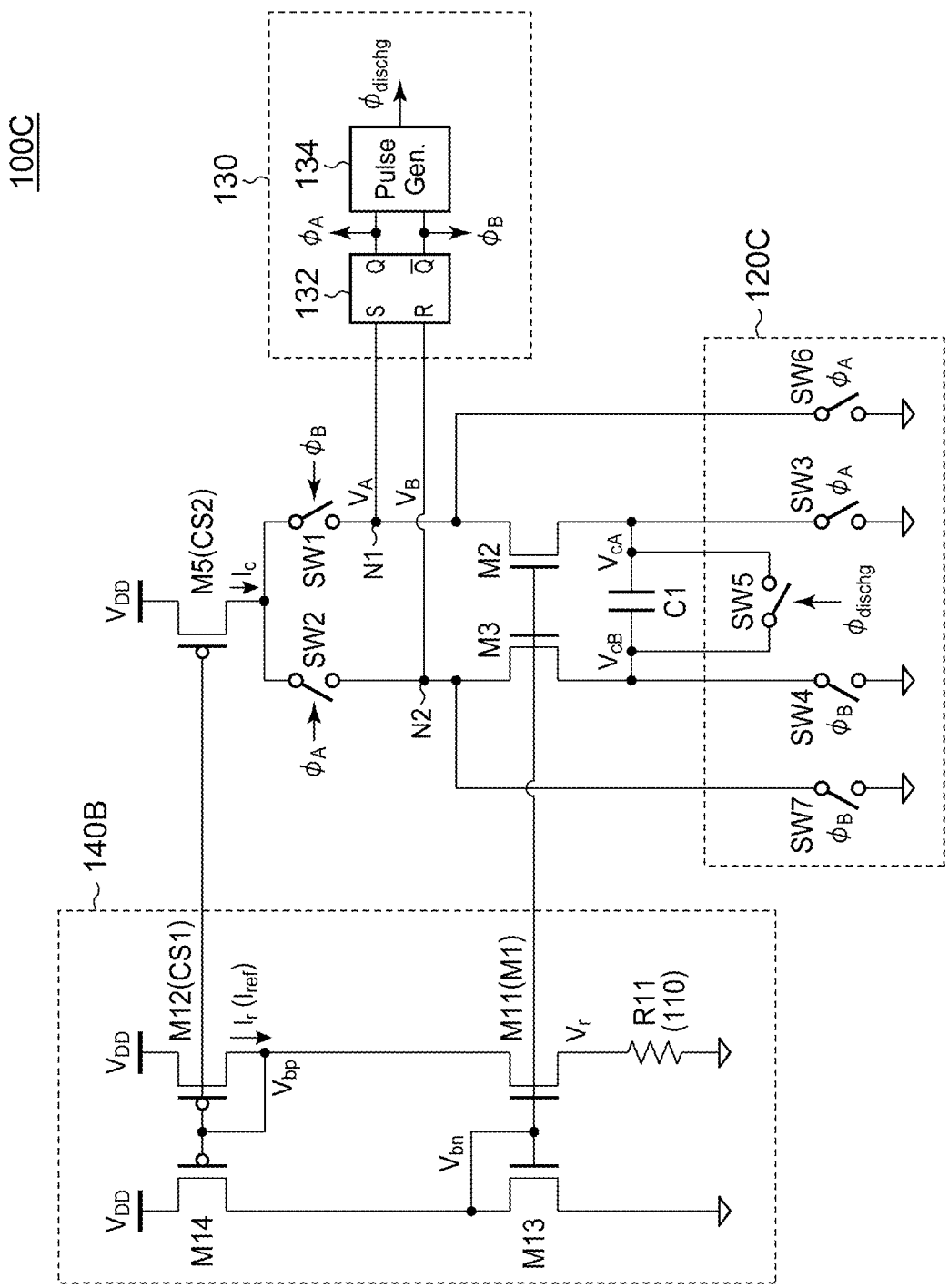
FIG. 10 is a circuit diagram of an oscillator circuit according to an example 3.

FIG. 10 is a circuit diagram of an oscillator circuit 100C according to an example 3. The charging/discharging circuit 120C of the oscillator circuit 100C further includes a sixth switch SW6 and a seventh switch SW7. The sixth switch SW6 is coupled between the first node N1 and the ground. The sixth switch SW6 turns on in the first state $\phi_A$. The seventh switch SW7 is coupled between the second node N2 and the ground. The seventh switch SW7 turns on in the second state $\phi_B$.

Figure 11:
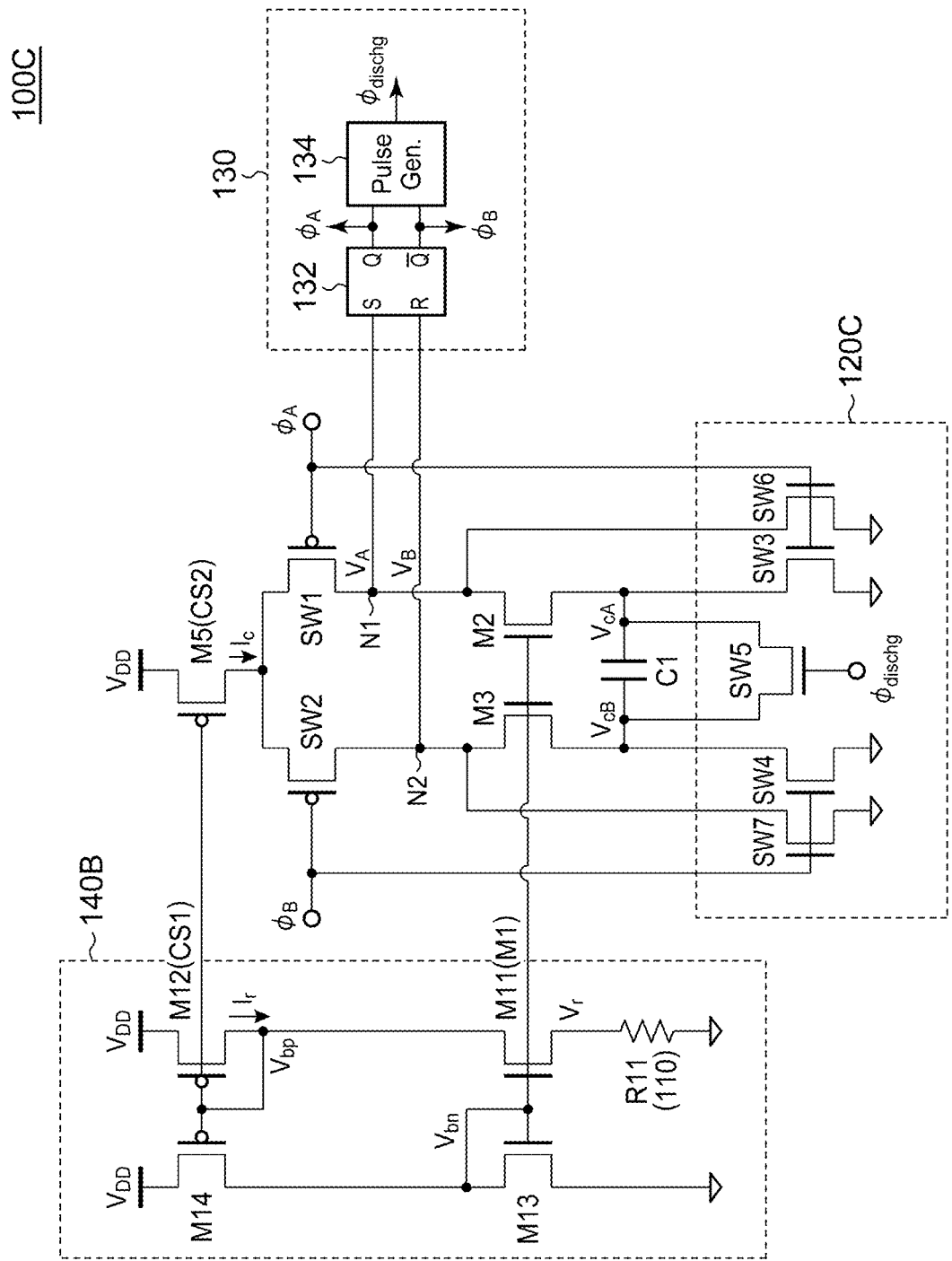
FIG. 11 is a more specific diagram of the oscillator circuit shown in FIG. 10.

FIG. 11 is a more specific circuit diagram of the oscillator circuit 100C shown in FIG. 10. The sixth switch SW6 and the seventh switch SW7 are each configured as an NMOS transistor. The gate of the sixth switch SW6 receives an input of the first control signal QA that is at the high level in the first state $\phi_A$. The gate of the seventh switch SW7 receives an input of the second control signal $\phi_B$ that is at the high level in the second state $\phi_B$.

The above is the configuration of the oscillator circuit 100C. Before description of the operation of the oscillator circuit 100C, description will be made with reference to FIG. 3 regarding a problem involved in the configuration that does not include the sixth switch SW6 and the seventh switch SW7 (FIG. 1 etc.).

In the waveform diagram shown in FIG. 3, the voltages $V_A$ and $V_B$ at the first node N1 and the second node N2 decrease to a voltage region that is somewhat higher than 0 V during the discharging period $\phi_{dischg}$. In this state, the second transistor M2 and the third transistor M3 each operate in the linear region. Accordingly, the second transistor M2 and the third transistor M3 are readily affected by PVT (process, voltage, and temperature) variations. As a result, with the oscillator circuit 100, there is the potential for frequency drift to occur in the oscillator circuit 100 due to temperature variation or power supply voltage variation.

Figure 12:
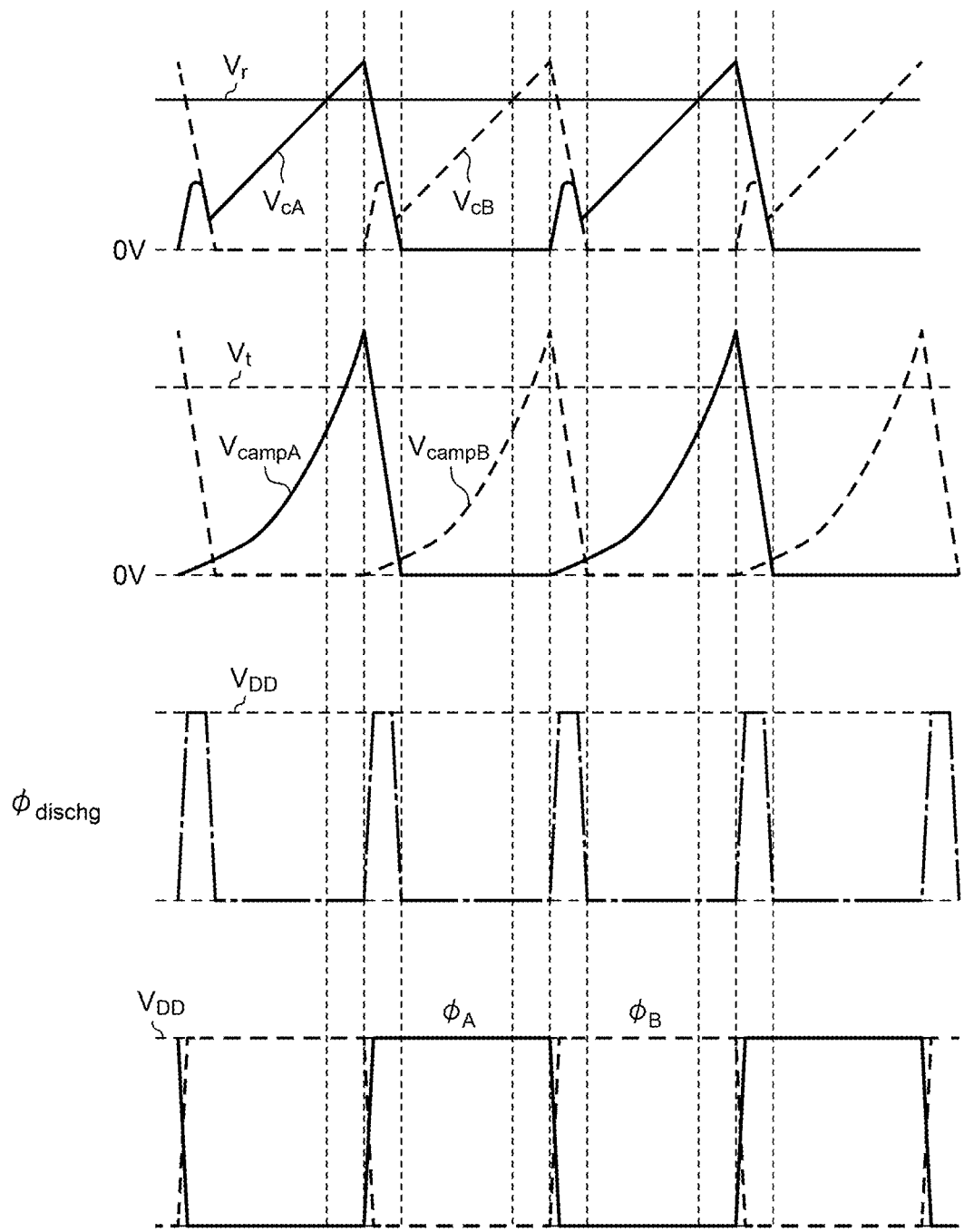
FIG. 12 is a waveform diagram showing the operation of the oscillator circuit shown in FIG. 10.

FIG. 12 is a waveform diagram showing the operation of the oscillator circuit 100C shown in FIG. 10. In the example 3, the oscillator circuit 100C further includes the sixth switch SW6 and the seventh switch SW7 as additional components. This lowers the voltages $V_A$ and $V_B$ at the first node N1 and the second node N2 to the vicinity of 0 V during the discharging period $\phi_{dischg}$. This allows the effects of frequency drift to be mitigated.

Example 4

Figure 13:
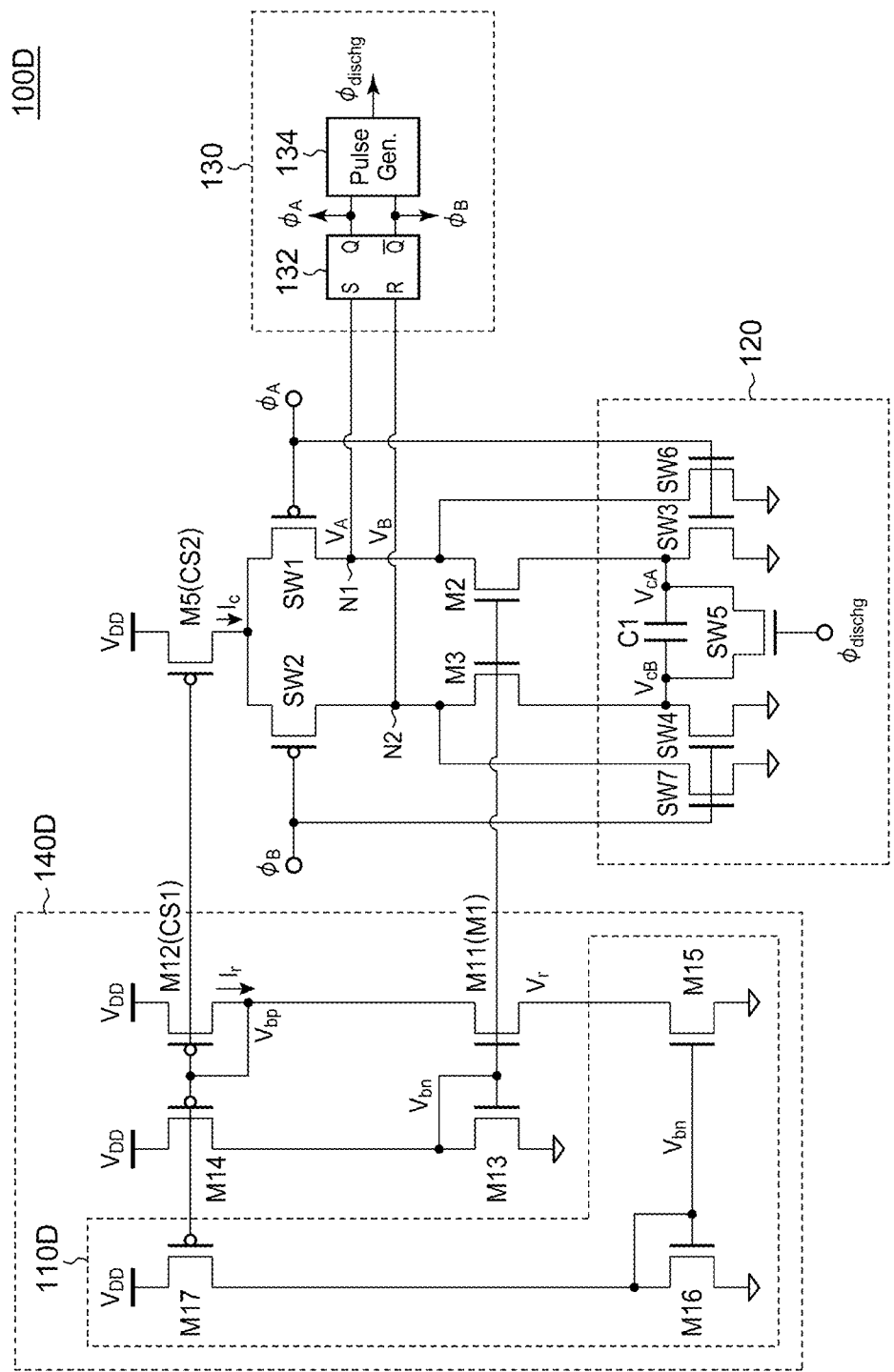
FIG. 13 is a circuit diagram of an oscillator circuit according to an example 4.

FIG. 13 is a circuit diagram of an oscillator circuit 100D according to an example 4. In the example 4, the reference current source 140D includes the first current source CS1, the first transistor M1, and the reference voltage circuit 110D as built-in components in the same manner as in the example 2 (FIG. 8). The reference voltage circuit 110D includes an NMOS transistor M15 provided between the source of the NMOS transistor M11 and the ground and a bias circuit 112 configured to supply a bias voltage Von to the gate of the NMOS transistor M15. The bias circuit 112 includes a PMOS transistor M17 and an NMOS transistor M16. The gate of the PMOS transistor M17 is coupled to the gates of the PMOS transistors M12 and M13. The NMOS transistor M16 is coupled between the drain of the PMOS transistor M17 and the ground.

Description will be made regarding preferable operating points of the reference current source 140D. The PMOS transistors M5, M12, M14, and M15 and NMOS transistors M2, M3, M11, and M13 are each operated in the weak inversion region (sub-threshold region Vgs<Vth). The NMOS transistor M16 is operated in the strong inversion region (Vgs>Vth). The NMOS transistor M15 is operated in the strong inversion region (Vgs>Vth) and the linear region (Vds<VGs−Vth).

With such an arrangement in which the operating points are designed as described above, this is capable of suppressing each current to the order of nanoamperes. This allows each element size to be reduced, thereby allowing the circuit area to be reduced.

With an arrangement employing the resistor R11 as shown in FIG. 8, in order to provide each current on the order of nanoamperes, such an arrangement requires a very large resistance, leading to a large circuit area. In contrast, with the present example employing the NMOS transistor M15 that operates in the strong inversion region and the linear region instead of the resistor R11, this allows the circuit area to be further reduced. In addition, with such an arrangement without resistors, this allows the number of mask layers to be reduced, thereby allowing the cost of the manufacturing process to be reduced.

Furthermore, the resistance characteristics of a MOS transistor have a positive temperature coefficient in the linear region. In contrast, the threshold value Vth of an NMOS transistor has a negative temperature coefficient. Accordingly, by adjusting the size of the transistor M15, this allows the temperature dependence of the current that flows through the β-multiplier self-bias circuit to be adjusted. This allows the frequency drift due to the temperature characteristics of $\tau_{comp}$ and $\tau_{delay}$ to be adjusted.

Example 5

Figure 14:
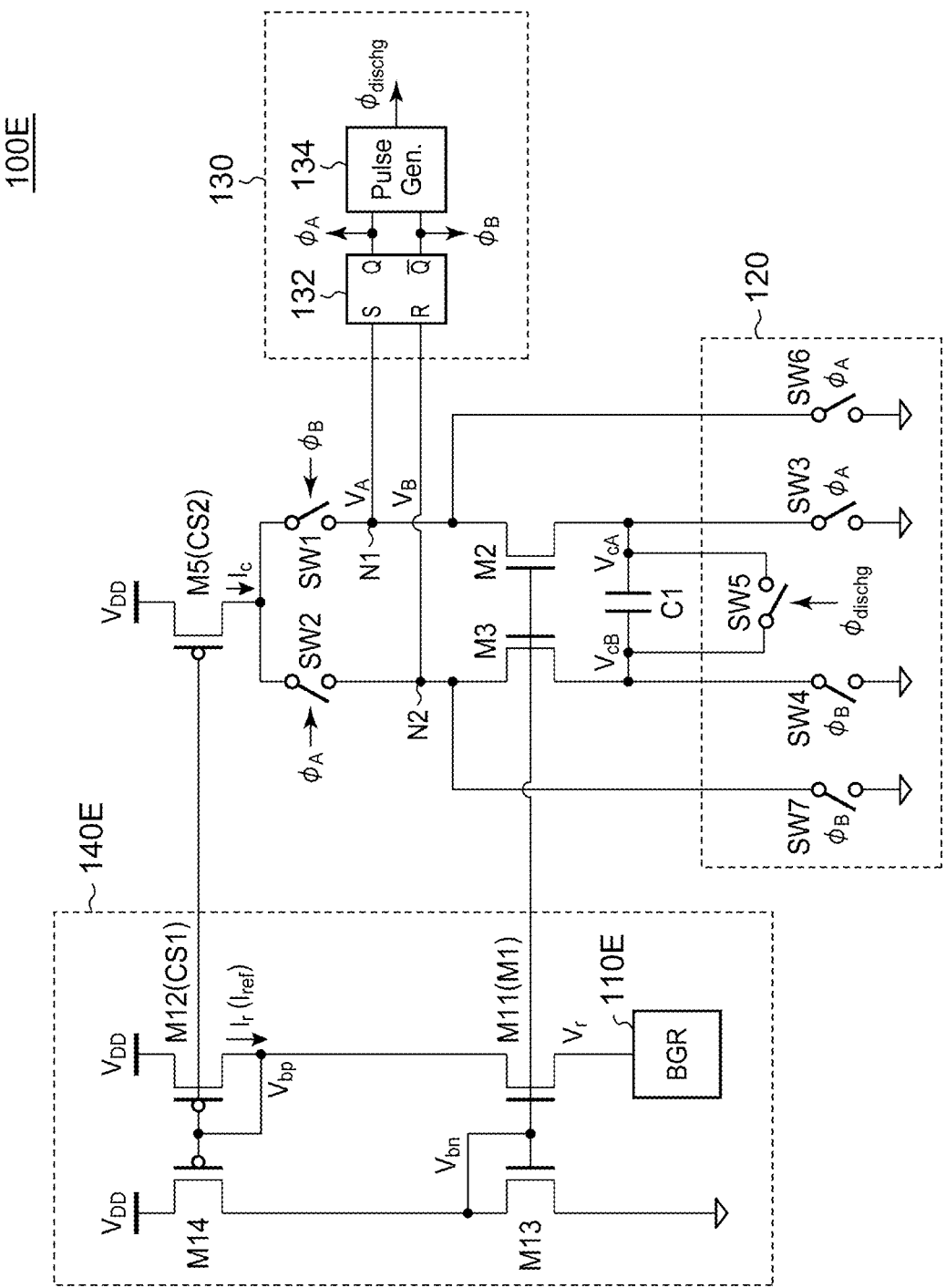
FIG. 14 is a circuit diagram of an oscillator circuit according to an example 5.

FIG. 14 is a circuit diagram of an oscillator circuit 100E according to an example 5. In the example 5, a reference voltage source such as a bandgap reference (BGR) circuit or the like is employed as the reference voltage circuit 110E.

In many cases, integrated circuits (ICs) and large scale integration (LSI) are each provided with a reference voltage source such as a bandgap reference circuit. Accordingly, with such an arrangement using a reference voltage generated by the reference voltage source instead of the resistor R11, such an arrangement allows the circuit area to be reduced while suppressing temperature drift of the frequency.

Example 6

Figure 15:
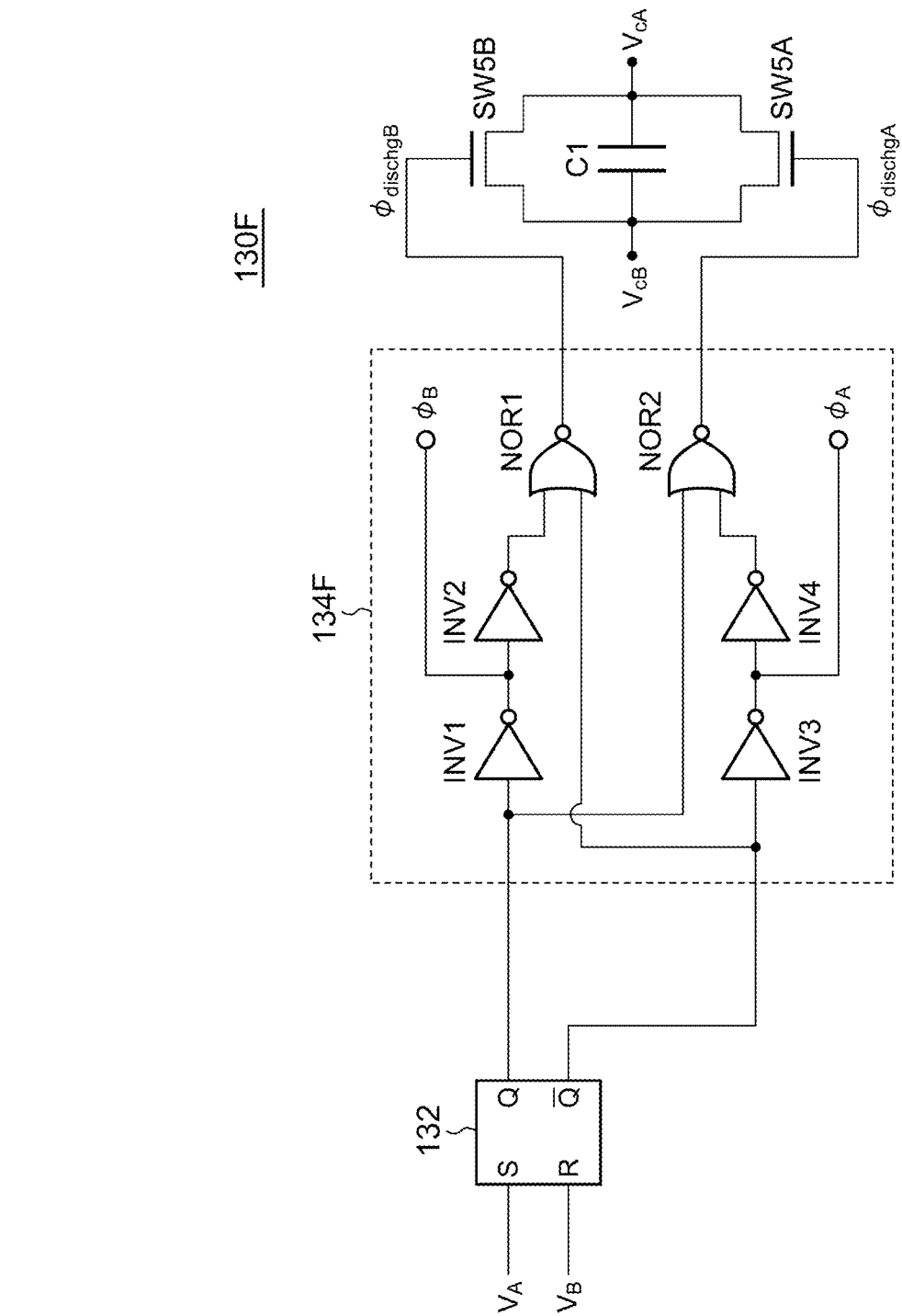
FIG. 15 is a circuit diagram of a pulse generator according to an example 6.

FIG. 15 is a circuit diagram of a pulse generator 134F according to an example 6. In this example, two fifth switches SW5A and SW5B are coupled in parallel with the capacitor C1.

The pulse generator 134F includes inverters INV1 to INV4, and NOR gates NOR1 and NOR2. The output of the NOR gate NOR1 is used as a discharging control signal $\phi_{dischgB}$ for the fifth switch SW5B. The output of the NOR gate NOR2 is used as a discharging control signal $\phi_{dischgA}$ for the fifth switch SW5A.

Furthermore, the output of the inverter INV3 is used as a control signal to be asserted in the first state $\phi_A$. The output of the inverter INV4 is used as a control signal to be asserted in the second state $\phi_B$.

The pulse generator 134F shown in FIG. 15 is formed of a NOR gate alone configured as a basic logical operation element. Such an arrangement eliminates the need for composite gates (OR1, AND1, AND2). This provides an advantage of reduced circuit area and improved delay time.

Example 7

Figure 16:
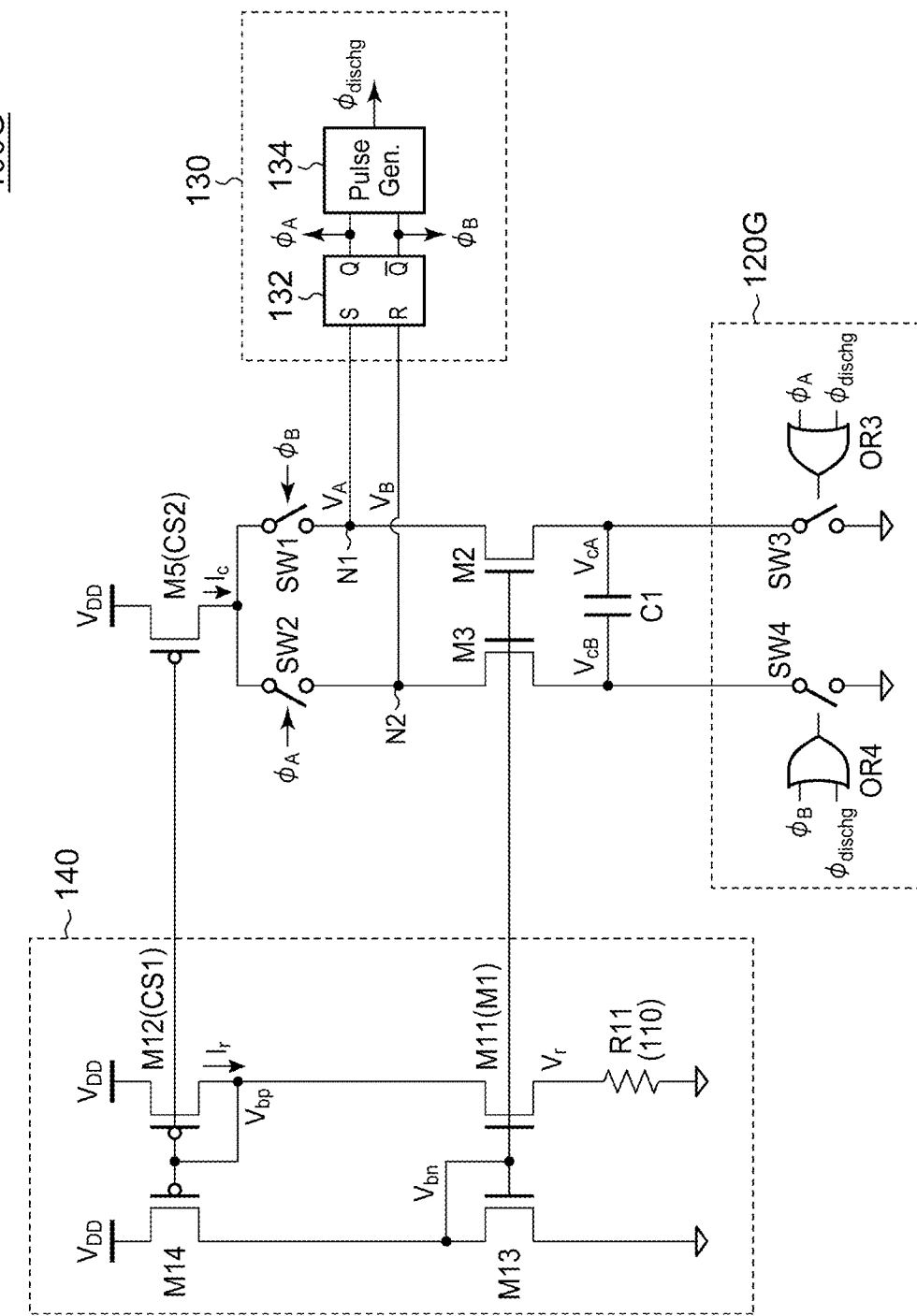
FIG. 16 is a circuit diagram of an oscillator circuit according to an example 7.

FIG. 16 is a circuit diagram of an oscillator circuit 100G according to an example 7. The charging/discharging circuit 120G includes a third switch SW3, a fourth switch SW4, and OR gates OR3 and OR4, and the fifth switch SW5 is omitted. The OR gate OR3 supplies the logical OR of the control signals $\phi_A$ and $\phi_{dischg}$ to the third switch SW3. The OR gate OR4 supplies the logical OR of the control signals $\phi_B$ and $\phi_{dischg}$ to the fourth switch SW4. In the discharging period $\phi_{dischg}$, both the third switch SW3 and the fourth switch SW4 are turned on. This sets the voltages $V_{cA}$ and $V_{cB}$ at both ends of the capacitor C1 to 0 V, thereby discharging the capacitor C1.

Modification

The configurations of the examples 1 through 7 described above can be combined as desired, and such combinations are also included in the scope of the present disclosure.

Usage

The usage of the oscillator circuit 100 is not restricted in particular. For example, the oscillator circuit 100 is suitably employed in a timer circuit.

The present embodiments described using specific terms show only an aspect of the mechanisms and applications of the present disclosure. Rather, various modifications and various changes in the layout can be made without departing from the spirit and scope of the present disclosure defined in appended claims.

Notes

An aspect of the technique disclosed in the present specification can be understood as follows.

Item 1

An oscillator circuit comprising:
a first current source structured to generate a first current,
a second current source structured to generate a second current,
a first node and a second node,
a first transistor having a drain coupled to the first current source,
a reference voltage circuit structured to generate a reference voltage at a source of the first transistor,
a capacitor,
a second transistor having a source coupled to a first end of the capacitor, a drain coupled to the first node, and a gate coupled to a gate of the first transistor,
a third transistor having a source coupled to a second end of the capacitor, a drain coupled to the second node, and a gate coupled to the gate of the first transistor,
a first switch coupled between the first node and the second current source,
a second switch coupled between the second node and the second current source,
a charging/discharging circuit comprising a third switch coupled between the first end of the capacitor and a ground and a fourth switch coupled between the second end of the capacitor and the ground; and
a control circuit structured to switch between (i) a first state in which the second switch and the third switch are turned on and the first switch and the fourth switch are turned off and (ii) a second state in which the second switch and the third switch are turned off and the first switch and the fourth switch are turned on based on a first voltage that occurs at the drain of the second transistor and a second voltage that occurs at the drain of the third transistor, and to control the charging/discharging circuit so as to discharge the capacitor in a discharging period that is a first portion of the first state and a discharging period that is a first portion of the second state.

Item 2

The oscillator circuit according to item 1, wherein the charging/discharging circuit further includes a fifth switch coupled in parallel with the capacitor and structured to be turned on in the discharging period.

Item 3

The oscillator circuit according to item 1, wherein the control circuit turns on the third switch and the fourth switch in the discharging period.

Item 4

The oscillator circuit according to any one of items 1 through 3, wherein the charging/discharging circuit further comprises:
a sixth switch coupled between the first node and the ground; and
a seventh switch coupled between the second node and the ground,
wherein the control circuit turns on the sixth switch and turns off the seventh switch in the first state,
and wherein the control circuit turns off the sixth switch and turns on the seventh switch in the second state.

Item 5

The oscillator circuit according to any one of items 1 through 4, further comprising a reference current source structured to generate a reference current,
wherein the first current source generates a first current that corresponds to the reference current,
and wherein the second current source generates a second current that corresponds to the reference current.

Item 6

The oscillator circuit according to item 5, wherein the reference current source comprises a β-multiplier self-bias circuit.

Item 7

The oscillator circuit according to item 6, wherein the first transistor, the reference voltage circuit, and the first current source are structured to also function as a part of the β-multiplier self-bias circuit.

Item 8

The oscillator circuit according to any one of items 1 through 7, wherein the reference voltage circuit comprises a resistor.

Item 9

The oscillator circuit according to any one of items 1 through 7, wherein the reference voltage circuit comprises a reference voltage source.

Item 10

The oscillator circuit according to any one of items 1 through 7, wherein the reference voltage circuit comprises an NMOS transistor with a gate thereof that receives a bias voltage.

Item 11

The oscillator circuit according to any one of items 1 through 10, wherein the control circuit comprises:
 a flipflop structured to be set according to the first voltage and to be reset according to the second voltage; and
 a pulse generator structured to generate a discharging control signal to be asserted in a predetermined period in response to a state transition of the flipflop.

What is claimed is:
1. An oscillator circuit comprising:
 a first current source structured to generate a first current;
 a second current source structured to generate a second current;
 a first node and a second node;
 a first transistor having a drain coupled to the first current source;
 a reference voltage circuit structured to generate a reference voltage at a source of the first transistor;
 a capacitor;
 a second transistor having a source coupled to a first end of the capacitor, a drain coupled to the first node and a gate coupled to a gate of the first transistor;
 a third transistor having a source coupled to a second end of the capacitor, a drain coupled to the second node, and a gate coupled to the gate of the first transistor;
 a first switch coupled between the first node and the second current source;
 a second switch coupled between the second node and the second current source;
 a charging/discharging circuit comprising a third switch coupled between the first end of the capacitor and a ground and a fourth switch coupled between the second end of the capacitor and the ground; and
 a control circuit structured to switch between (i) a first state in which the second switch and the third switch are turned on and the first switch and the fourth switch are turned off and (ii) a second state in which the second switch and the third switch are turned off and the first switch and the fourth switch are turned on based on a first voltage that occurs at the drain of the second transistor and a second voltage that occurs at the drain of the third transistor, and to control the charging/discharging circuit so as to discharge the capacitor in a discharging period that is a first portion of the first state and a discharging period that is a first portion of the second state.

2. The oscillator circuit according to claim 1, wherein the charging/discharging circuit further includes a fifth switch coupled in parallel with the capacitor and structured to be turned on in the discharging period.

3. The oscillator circuit according to claim 1, wherein the control circuit turns on the third switch and the fourth switch in the discharging period.

4. The oscillator circuit according to claim 1, wherein the charging/discharging circuit further comprises:
 a sixth switch coupled between the first node and the ground; and
 a seventh switch coupled between the second node and the ground,
 wherein the control circuit turns on the sixth switch and turns off the seventh switch in the first state,
 and wherein the control circuit turns off the sixth switch and turns on the seventh switch in the second state.

5. The oscillator circuit according to claim 1, further comprising a reference current source structured to generate a reference current,
 wherein the first current source generates a first current that corresponds to the reference current,
 and wherein the second current source generates a second current that corresponds to the reference current.

6. The oscillator circuit according to claim 5, wherein the reference current source comprises a β-multiplier self-bias circuit.

7. The oscillator circuit according to claim 6, wherein the first transistor, the reference voltage circuit, and the first current source are structured to also function as a part of the β-multiplier self-bias circuit.

8. The oscillator circuit according to claim 1, wherein the reference voltage circuit comprises a resistor.

9. The oscillator circuit according to claim 1, wherein the reference voltage circuit comprises a reference voltage source.

10. The oscillator circuit according to claim 1, wherein the reference voltage circuit comprises an NMOS transistor with a gate thereof that receives a bias voltage.

11. The oscillator circuit according to claim 1, wherein the control circuit comprises:
 a flipflop structured to be set according to the first voltage and to be reset according to the second voltage; and
 a pulse generator structured to generate a discharging control signal to be asserted in a predetermined period in response to a state transition of the flipflop.

* * * * *